(12) United States Patent
Sekiya

(10) Patent No.: US 6,344,402 B1
(45) Date of Patent: Feb. 5, 2002

(54) METHOD OF DICING WORKPIECE

(75) Inventor: Kazuma Sekiya, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 09/624,043

(22) Filed: Jul. 24, 2000

(30) Foreign Application Priority Data

Jul. 28, 1999 (JP) .......................................... 11-213437

(51) Int. Cl.$^7$ ......................... H01L 21/46; H01L 21/78; H01L 21/301

(52) U.S. Cl. ....................... 438/460; 438/462; 438/464

(58) Field of Search ............................... 438/460, 461, 438/462, 463, 464, 465

(56) References Cited

U.S. PATENT DOCUMENTS 5,888,883 A * 3/1999 Sasaki et al.

* cited by examiner

*Primary Examiner*—Kevin M. Picardat
*Assistant Examiner*—D. M. Collins
(74) *Attorney, Agent, or Firm*—Rader, Fishman, & Grauer, PLLC

(57) ABSTRACT

Disclosed is a dicing method using a dicing apparatus comprising at least a chuck table holding workpiece attached a frame via an adhesive tape, and dicing means for cutting a workpiece into small square pieces. The workpiece is cut into small square pieces in the state of being held in the frame, and a blow of air is ejected from the surface of the chuck table to the diced workpiece to expand the adhesive tape in the semispherical form. As a result, adjacent square pieces are put apart from each other, thus making adjacent square pieces even if they remain partly contiguous to be forcedly put apart from each other.

3 Claims, 8 Drawing Sheets

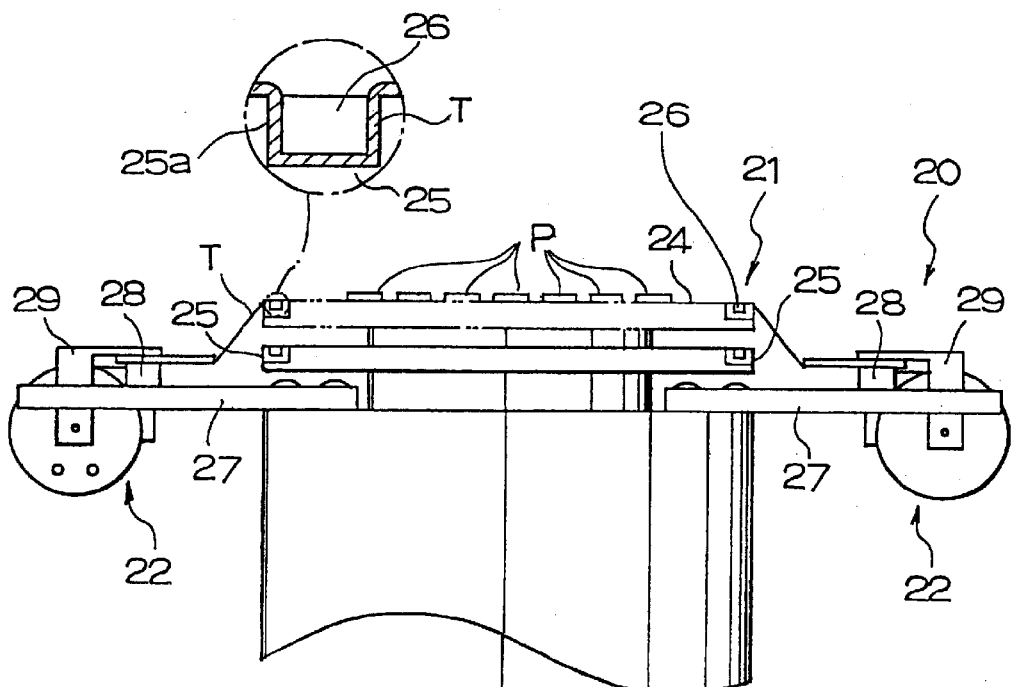
FIG. 8B
FIG. 8A
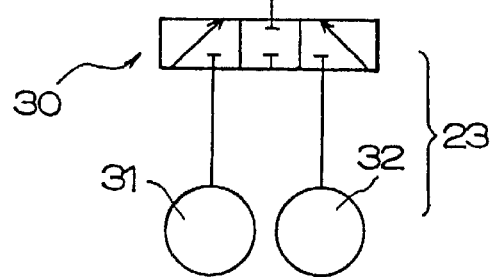
FIG. 9
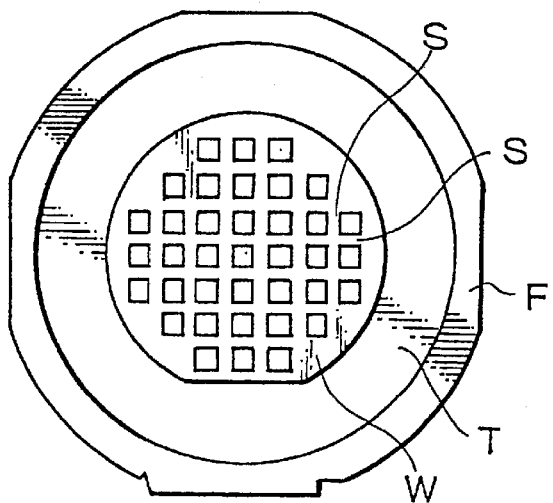

FIG. 10
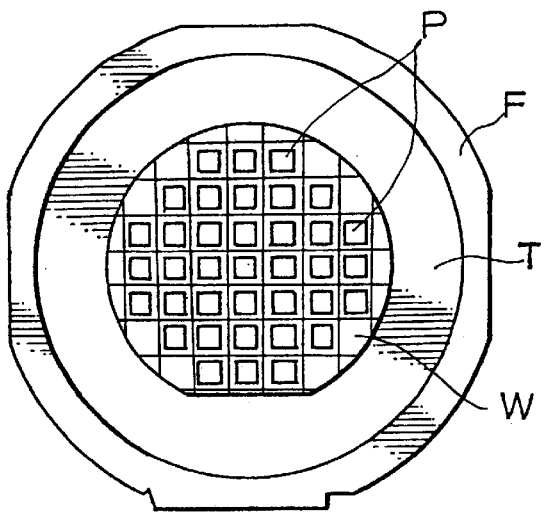
FIG. 11
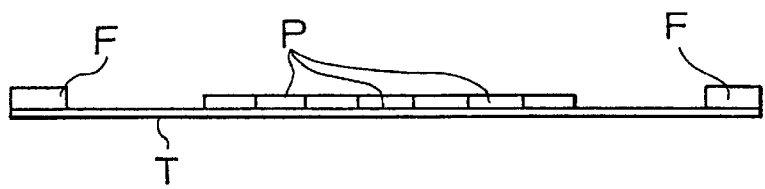
FIG. 12B
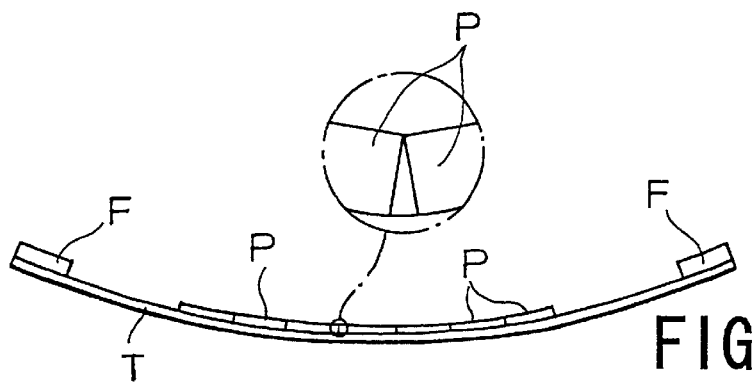
FIG. 12A

METHOD OF DICING WORKPIECE

BACKGROUND OF THE INVENTION

1. Field of the Invention

The present invention relates to a method of dividing a workpiece such as a semiconductor wafer into small square pieces even if some adjacent square pieces are not completely separated.

2. Related Arts

Referring to FIG. 9, a workpiece to be diced such as a semiconductor wafer W is attached to an associated frame F with an adhesive tape T to provide a workpiece-and-frame combination. As shown, the semiconductor wafer W has a lattice-like pattern defined by crossing streets S, each square area in the lattice containing a circuit pattern. The wafer W is cut into separate squares to provide pellets P, as seen in FIG. 10.

Referring to FIG. 11, the individual pellets P remain on the adhesive tape T, which is stretched across the frame F. The diced wafer-and-frame combination is washed to remove minute debris, and then the diced wafer-and-frame combination is transported to the pellet picking-up station where individual pellets P are removed from the adhesive tape T. It is transported to follow sequential manufacturing stations. Transportation of pellets in the form of diced wafer-and-frame combination is convenient, compared with transportation of individual pellets after being separated from their frames.

Transportation of diced wafer-and-frame combinations, however, has some defects attributable to use of adhesive tapes.

If some adjacent pellets are not completely separated from each other in cutting a semiconductor wafer, such pellets cannot be removed individually when being peeled off from the underlying adhesive tape.

Even if the semiconductor wafer is cut completely, the pellets are so close to each other that some adjacent pellets may be put in contact with each other when the adhesive tape is somewhat loosened (see FIGS. 12A and 12B), and then, such adjacent pellets are apt to rub against each other, causing cracking or damaging of pellets on their adjacent edges. This accident is likely to take place on the way to subsequent manufacturing station.

Minute debris remaining between adjacent pellets are difficult to be removed in washing, and pellets can be contaminated with such minute debris when they come up to the upper surfaces of some pellets later.

There has been, therefore, an increasing demand for an improved dicing method capable of providing diced wafer-and-frame combinations which are guaranteed to be free of such defects as described above.

SUMMARY OF THE INVENTION

To meet such demand a method of dicing workpiece by using a dicing apparatus comprising at least a chuck table holding workpiece attached to a frame via an adhesive tape, and dicing means for cutting a workpiece into small square pieces, said method comprising the steps of: cutting the workpiece into small square pieces in the state of being held in the frame; and ejecting a blow of air from the surface of the chuck table to the cut workpiece to expand the adhesive tape in the semispherical form.

The dicing method may further comprise the step of, subsequent to expansion of the adhesive tape, expanding the inter-spaces between adjacent small square pieces to keep them apart from each other still more.

Workpiece may be semiconductor wafer.

The dicing method according to the present invention assures that: the adhesive tape is expanded and stretched to make adjacent pellets to be separated from each other, thereby separating completely some adjacent pellets from each other even if they are partly contiguous, preventing any physical interference of adjacent pellets and permitting complete removal of minute debris from the inter-spaces between adjacent pellets.

Other objects and advantages of the present invention will be understood from the following description of a dicing method according to one preferred embodiment of the present invention.

BRIEF DESCRIPTION OF THE DRAWING

FIGS. 8A and 8B are side views of the chuck table-and-frame holder, illustrating how the pellet-to-pellet intervals can be kept fixedly;

FIG. 9 is a plane view of the pre-dicing wafer-and-frame combination;

FIG. 10 is a plane view of the post-dicing wafer-and-frame combination;

FIG. 11 illustrates how pellets are arranged on the adhesive tape after the wafer is diced; and FIGS. 12A and 12B illustrate how individual pellets are put in contact when the adhesive tape is bent.

DETAILED DESCRIPTION OF PREFERRED EMBODIMENT

Figure 1:
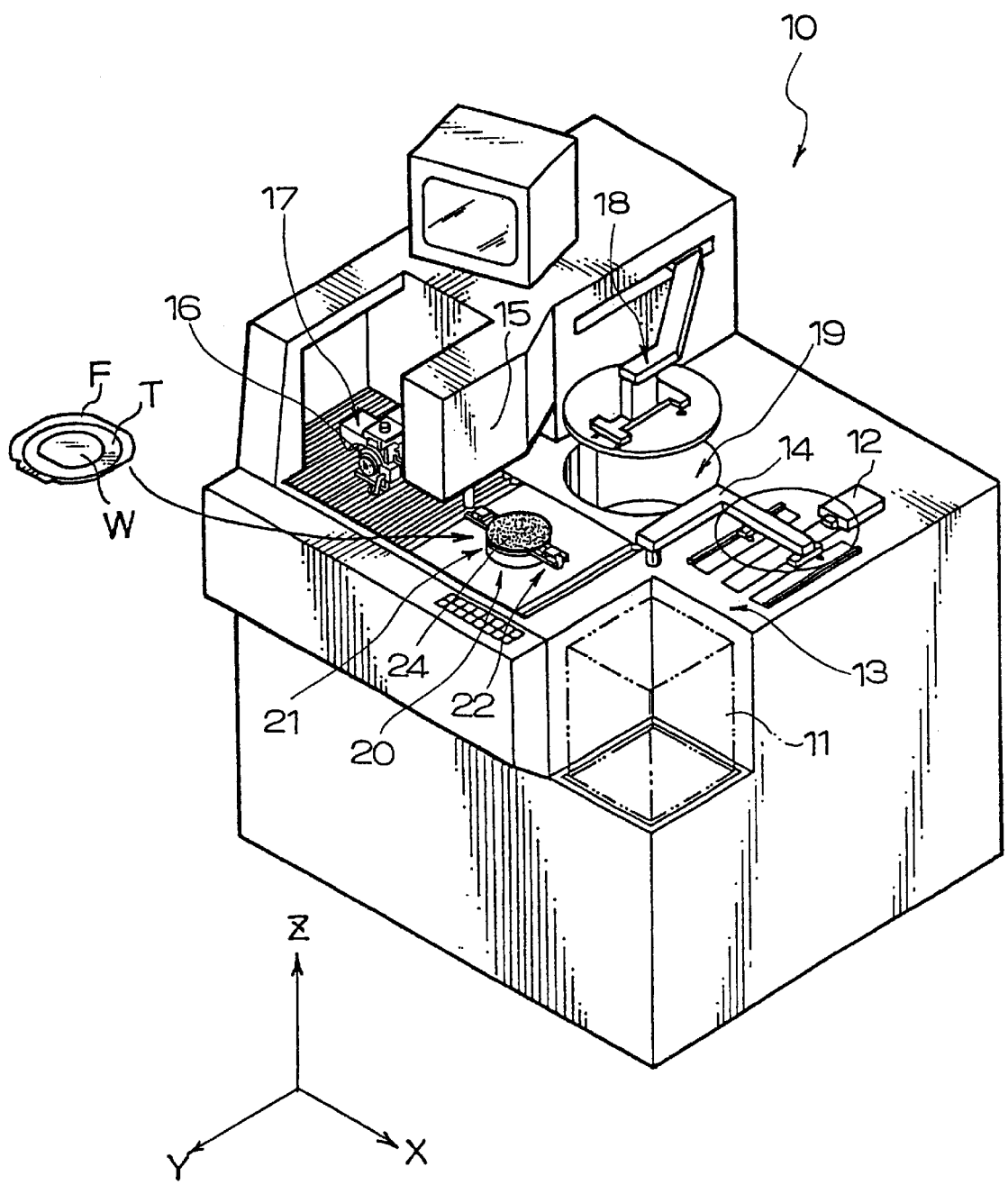
FIG. 1 is a perspective view of a cutting apparatus for use in dicing workpiece according to the dicing method of the present invention.

The manner in which a dicing apparatus 10 of FIG. 1 is used to cut a semiconductor wafer into small squares according to the present invention is described below.

Referring to FIG. 1, the semiconductor wafer W is held in associated frame F by attaching the semiconductor wafer W to an adhesive tape T, which covers the opening of the frame F. A large number of wafer-and-frame combinations are contained in a cassette 11.

The taking-out and -in means 12 takes a selected wafer-and-frame combination out of the cassette 11 to put it on the tentative storage area 13. Then, the first transferring means 14 sucks and carries the wafer-and-frame combination to the holding-and-carrying section 20 where a negative pressure is applied to the wafer-and-frame combination to be held there.

Figure 2:
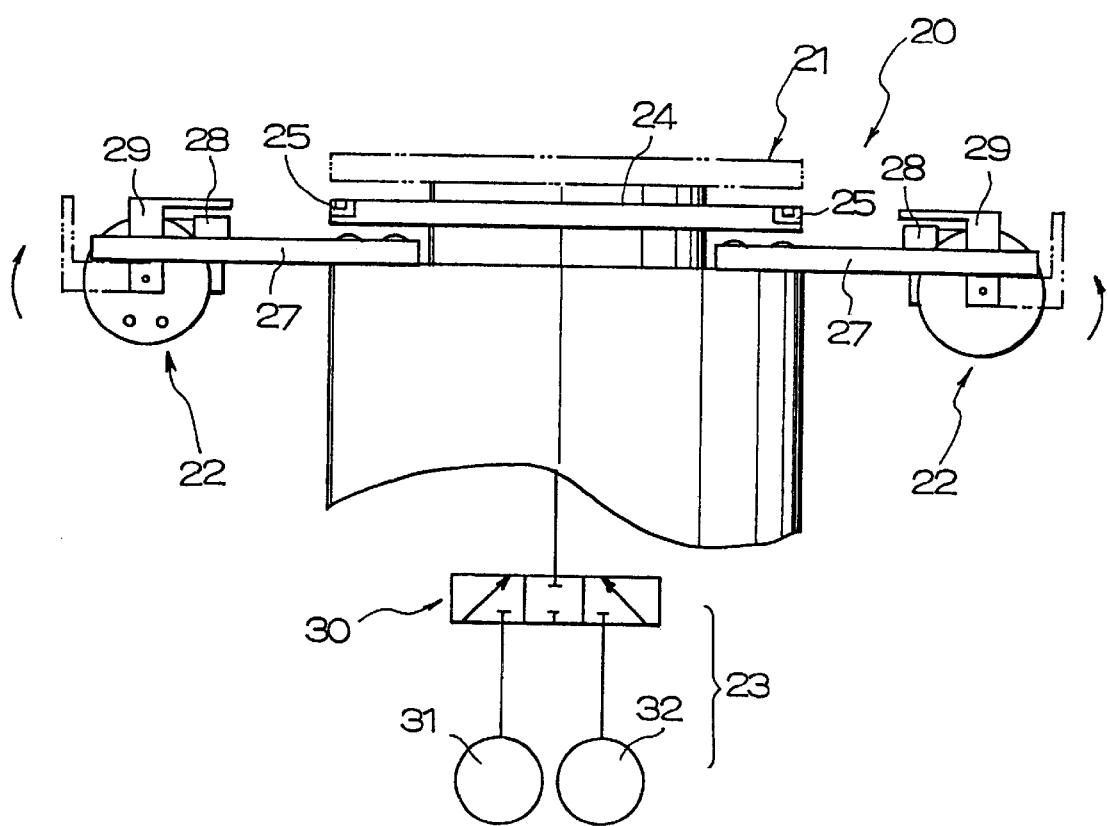
FIG. 2 illustrates the chuck table equipped with a frame holder in the cutting apparatus.

Referring to FIG. 2, the holding-and-carrying section 20 comprises a chuck table 21, a frame holder 22 for pushing the frame against the chuck table 21 and for gripping the same thereon and a pressure switching control 23 communicating the chuck table 21 for selectively applying a negative or positive pressure to the chuck table 21.

Figure 3:
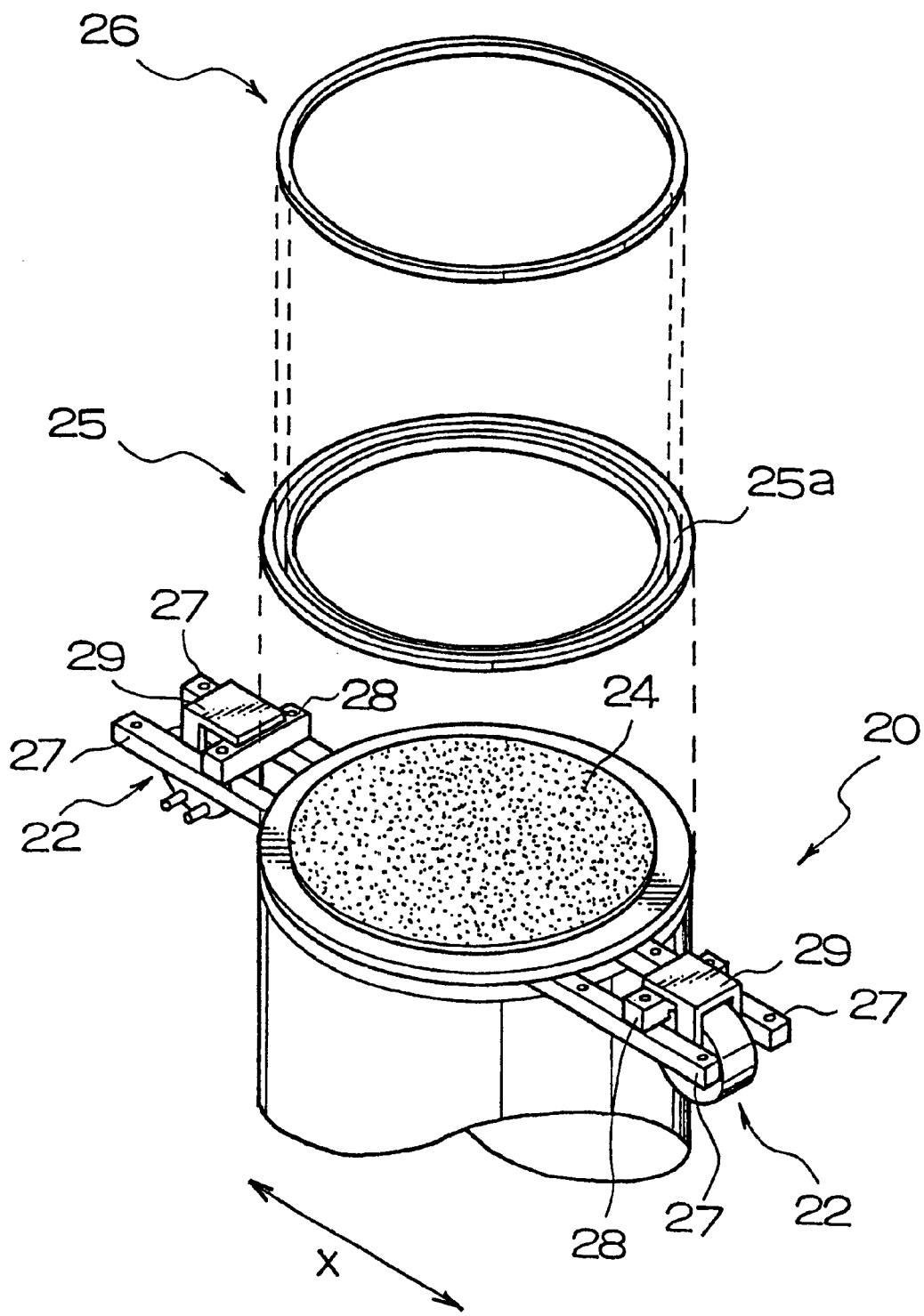
FIG. 3 is an exploded perspective view of the chuck table, showing how the chuck table is combined with the frame holder.

Referring to FIG. 3, the chuck table 21 has a porous surface 24 surrounded by a tape-stretching concave ring 25. Specifically the concave ring 25 has a circular groove 25a formed on its upper side. The circular groove 25a has predetermined width and depth to allow a counter convex ring 26 to be snapped in the concave ring 25a.

The frame holder 22 has a pair of parallel guide rails 27 extending outward from the diametrically opposite points of the circumference of the table base in the X-direction, and two sliding grippers 28 ride on the guide rails 27 so that the grippers 28 may be adjusted in position to sandwich the frame F on the chuck table 21.

Each sliding gripper 28 includes a rotary piece 29, which can be tilted a desired angle for pinching the frame F between the lower surface of the rotary piece 29 and the upper surface of the gripper body.

As seen from FIG. 2, the pressure switching control 23 comprises a switching valve 30, an air-suction 31 and an air-supply 32, thus permitting either of the air-suction 31 and the air-supply 32 to be selectively connected to the chuck table 21 for applying a negative or positive pressure to the porous surface 24 for pulling or pushing the overlying adhesive tape T apart from the chuck table 21.

Figure 4:
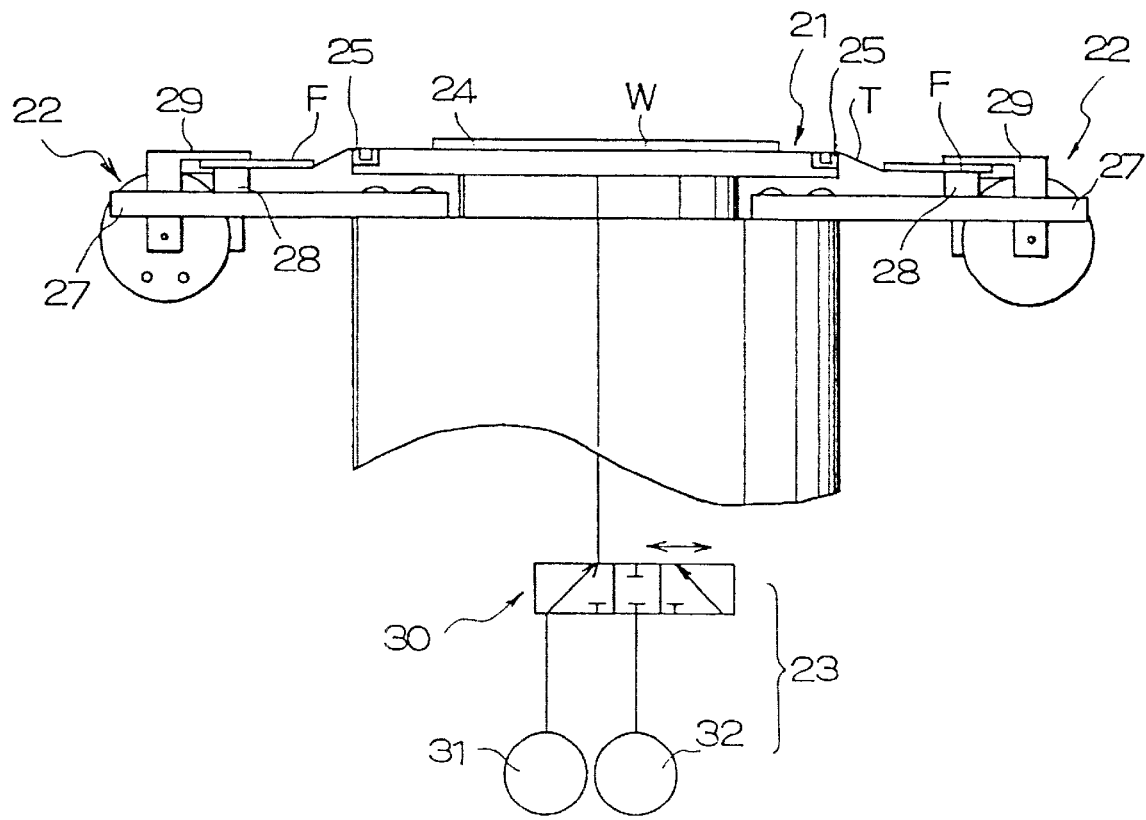
FIG. 4 is a side view of the chuck table-and-frame holder assembly, showing how a wafer-and-frame combination is held.
Figure 5:
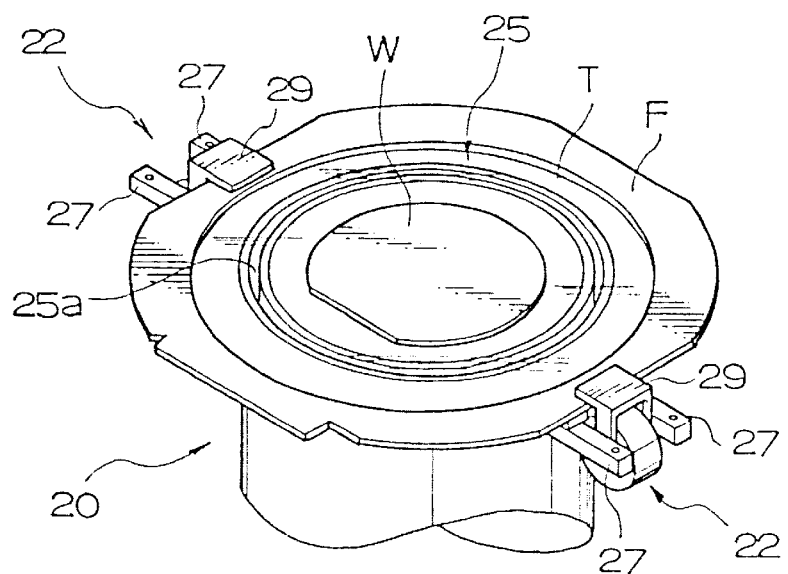
FIG. 5 is a perspective view of the chuck table-and-frame holder assembly, showing how the wafer-and-frame combination is held.

Referring to FIG. 4, when a wafer-and-frame combination is put on the chuck table 21 with the frame F pinched and held by the rotary pieces 29, the switching valve 30 is switched to permit the air-suction 31 to communicate the porous surface 24 of the chuck table 21, thus drawing the overlying adhesive tape T along with the semiconductor wafer W close to the surface 24 of the chuck table 21. As seen from FIG. 5, the tape-stretching concave ring 25 is visible under the transparent or semi-transparent tape T.

Referring to FIG. 1 again, the holding-and-carrying section 20 moves in the X-direction to bring the wafer-and-frame combination under the alignment means 15, and then, a selected street S on the wafer W is put in alignment with the cutting blade 16. When the holding-and-carrying section 20 is moved in the X-direction, the wafer W is cut along the selected street S with the cutting blade 16, which is rotating at an increased speed. Every time the wafer W has been cut along the selected street S, the wafer W is shifted a distance equal to the street-to-street interval in the Y-direction, and the holding-and-carrying section 20 is moved back and forth repeatedly in the X-direction so that the wafer W may be cut sequentially along its streets S in one direction.

After the wafer w has been cut along all streets in one direction, the chuck table 21 is rotated 90 degrees, and then, the same cutting procedure is repeated to cut the wafer W along all streets S in the other direction. Thus, the wafer W is cut into separate small squares (dicing step).

Figure 6:
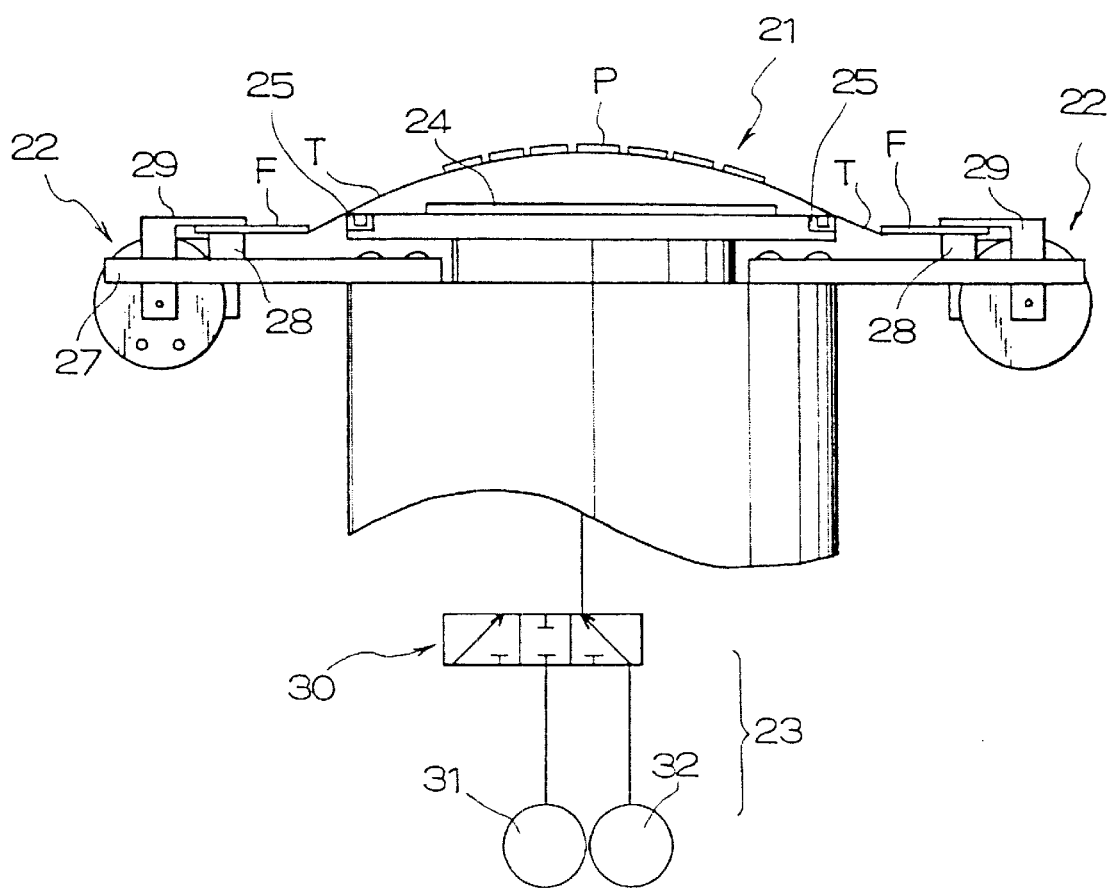
FIG. 6 is another side view of the chuck table-and-frame holder assembly, showing how the adhesive tape is expanded.

After completing the dicing of the wafer W the holding-and-carrying section 20 is moved back to its original position, and then, the switching valve 30 is switched to permit the air-supply 32 to communicate the porous surface 24 of the chuck table 21, thus pushing the overlying adhesive tape T along with the diced wafer w apart from the surface 24 of the chuck table 21, as seen from FIG. 6. Then, the overlying tape T is expanded to be semi-spherical in shape, thereby applying a bending force to the diced wafer W to put adjacent pellets P apart from each other. Partly contiguous pellets, if any will be forcedly separated. The switching valve 30 shuts to stop the flow of air, thereby keeping the overlying tape T semi-spherical in shape (tape expanding step).

Expansion of pellet-to-pellet interval assures that individual pellets can be removed separately from the adhesive tape at the pellet picking-up station. The adhesive tape T can be stretched effectively if the chuck table 21 is raised above the frame holder 22, as seen from the chuck table 21 indicated by broken lines in FIG. 2.

Usually the adhesive tape T once expanded is liable to return to its initial size when it is released from the expanding stage, thus allowing adjacent pellets to come close to each other.

Figure 7:
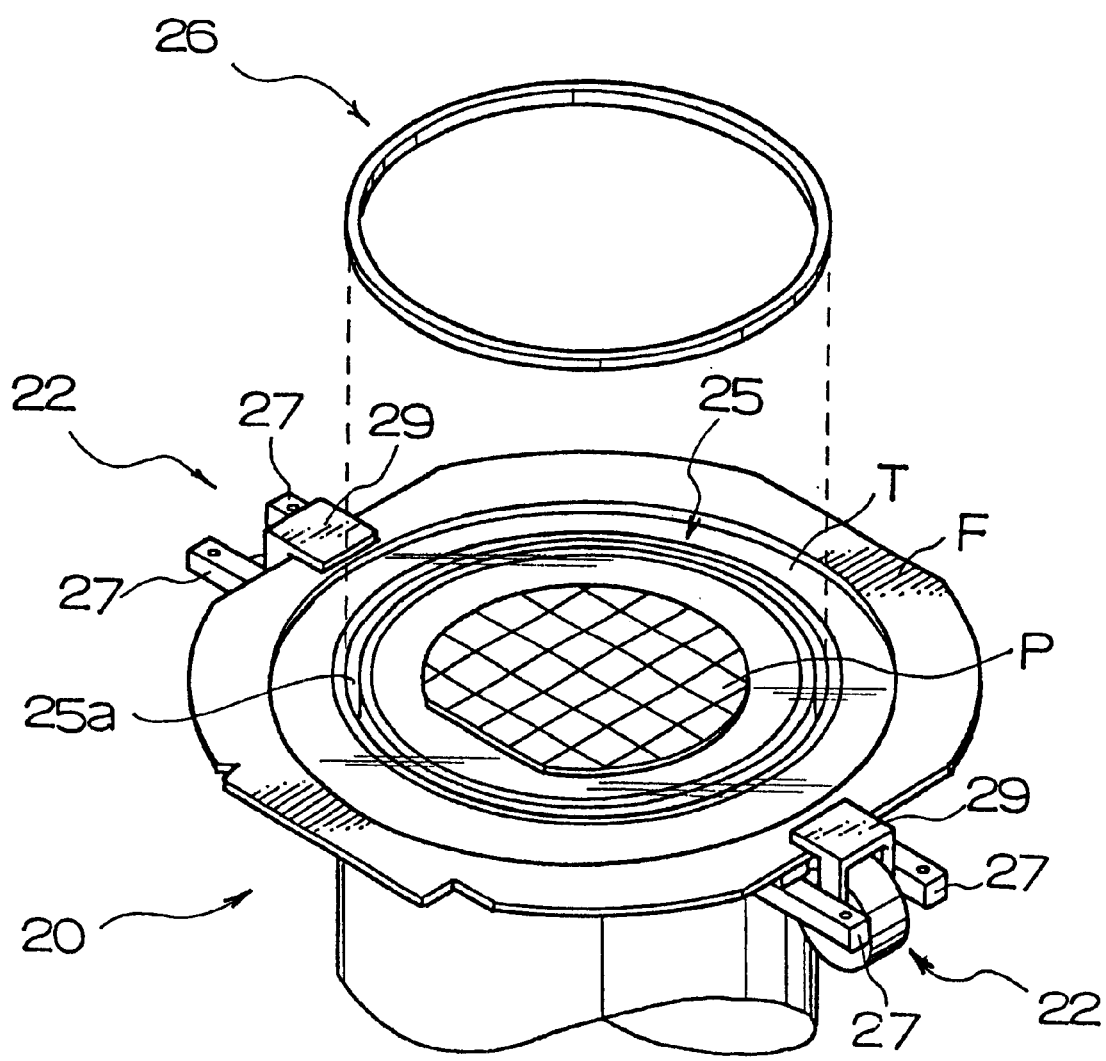
FIG. 7 is a perspective view of the chuck table-and-frame holder, illustrating how the pellet-to-pellet intervals can be kept fixedly.

Referring to FIGS. 8A and 8B, after expanding the adhesive tape T (see FIG. 6) the chuck table 21 is raised up to its raised position (broken lines in FIG. 8B), and then, the tape-stretching convex ring 26 is fitted in the counter concave ring 25, which is fixed to the chuck table 21 (see FIG. 7). Specifically the circumference of the adhesive tape T traversing the circumference groove 25a of the concave ring 25 is pushed into the circumference groove 25a by the convex ring 26, thereby stretching the adhesive tape T even more (pellet-to-pellet interval increasing step).

The frame F is released from the frame holder 22, and then, the wafer-and-frame combination is released from the holding-and-carrying section 20. The wafer-and-frame combination has adjacent pellets separated apart from each other on its expanded adhesive tape T. Thus, there is no fear for physical interference between adjacent pellets, which physical interference would cause undesired cracks on the confronting edges of adjacent pellets while being carried to subsequent manufacturing station.

After expanding the pellet-to-pellet intervals are increased, the convex ring 26 is removed from the circumference groove 25a of the concave ring 25, and the wafer-and-frame combination is released from the frame holder 22. The wafer-and-frame combination is sucked by the frame F on the second transporting means 18 to be transported to the washing area 19.

In the washing area 19 water is ejected to the diced wafer to wash away minute debris if any, from pellet-to-pellet intervals, which are so increased as to assure complete removal of minute debris from pellet-to-pellet intervals. Thus, there is no fear of contaminating pellets with minute debris, which would transfer from pellet-to-pellet spaces to pellet surfaces later.

After being washed the wafer-and-frame combination is transported to the tentative storage area 13, and then, it is taken in the cassette 11 by the taking-out and -in means 12. The cassette 11 when loaded with wafer-and-frame combinations is transported to the pellet picking-up station.

In the pellet picking-up station pellets P are sucked to be removed from the adhesive tape T without being accompanied by any adjacent pellet.

In dicing wafers the cutting apparatus of FIG. 1 uses a rotary blade, but a point scriber, a roll scriber, a laser cutter or any other cutting tool may be used for dicing wafers.

A point scriber can be used in dicing several tens micron-thick wafers, and in case that wafers cannot be diced completely, their adhesive tapes are expanded to put adjacent small squares apart from each other according to the present invention.

As may be understood from the above, diced wafers each lined with an adhesive tape can be put their small squares apart from each other by expanding their adhesive tapes, thus assuring that no adjacent small squares remain partly contiguous to each other, thereby permitting individual pellets to be removed from the adhesive tape without difficulty.

Adjacent pellets on the adhesive tape are separated a good distance apart from each other, preventing their cracking which would be caused from their physical interference during their transportation if adjacent pellets were close to each other. Thus, the quality of pellets cannot be lowered.

Adjacent pellets on the adhesive tape are separated a good distance apart from each other, permitting complete removal of minute debris from pellet-to-pellet spaces while diced wafers are washed. Thus, there is no possibility of pellets being contaminated with minute debris. Thus, the quality of pellets cannot be spoiled.

What is claimed is:

1. A method of dicing workpiece by using a dicing apparatus comprising at least a chuck table holding workpiece attached to a frame via an adhesive tape, and dicing means for cutting a workpiece into small square pieces, said method comprising the steps of:

cutting the workpiece into small square pieces in the state of being held in the frame; and ejecting a blow of air from the surface of the chuck table to the cut workpiece to expand the adhesive tape in the semispherical form.

2. A method of dicing workpiece according to claim 1, further comprising the step of, subsequent to expansion of the adhesive tape, expanding the inter-spaces between adjacent small square pieces to keep them apart from each other still more.

3. A method of dicing workpiece according to claim 1 or 2, wherein the workpiece is semiconductor wafer.

\* \* \* \* \*